(12) United States Patent
Wang

(10) Patent No.: US 6,773,958 B1
(45) Date of Patent: Aug. 10, 2004

(54) INTEGRATED ASSEMBLY-UNDERFILL FLIP CHIP PROCESS

(75) Inventor: Wen-chou Vincent Wang, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 100 days.

(21) Appl. No.: 10/274,258

(22) Filed: Oct. 17, 2002

(51) Int. Cl.[7] .......... H01L 21/00; H01L 21/44; H01L 21/48
(52) U.S. Cl. .......... 438/108; 438/106
(58) Field of Search .......... 438/108, 106, 438/127

(56) References Cited

U.S. PATENT DOCUMENTS

| | | | | |
|---|---|---|---|---|
| 5,975,408 A | * | 11/1999 | Goossen ............ | 228/173.2 |
| 6,458,472 B1 | * | 10/2002 | Konarski et al. ...... | 428/620 |
| 6,475,828 B1 | * | 11/2002 | Hoang ............... | 438/108 |
| 6,660,560 B2 | * | 12/2003 | Chaudhuri et al. ...... | 438/108 |
| 6,667,194 B1 | * | 12/2003 | Crane et al. .......... | 438/127 |
| 2001/0003058 A1 | * | 6/2001 | Gilleo et al. .......... | 438/612 |
| 2002/0167077 A1 | * | 11/2002 | Vincent .............. | 257/684 |
| 2003/0080437 A1 | * | 5/2003 | Gonzalez et al. ...... | 257/778 |
| 2003/0096452 A1 | * | 5/2003 | Yin et al. ............ | 438/108 |

* cited by examiner

*Primary Examiner*—Van Thu Nguyen
*Assistant Examiner*—Beth E. Owens
(74) *Attorney, Agent, or Firm*—Beyer Weaver & Thomas LLP

(57) ABSTRACT

Provided are flip chip device assembly methods that integrate the solder joining and underfill operations of the assembly process. Solder joining of the die and substrate and curing of the underfill material between the die and substrate is accomplished in the same heating and cooling operation. As a result, the coefficient of thermal expansion (CTE) mismatch stresses incurred prior to application and curing of underfill by a device packaged according to the conventional technique having a separate heating and cooling operation following solder joining, are avoided. These stresses are of particular concern in smaller device size technologies (e.g., 0.13 microns and smaller) using low k dielectrics and large die sizes due the difference in CTP between the die and substrate.

12 Claims, 3 Drawing Sheets

INTEGRATED ASSEMBLY-UNDERFILL FLIP CHIP PROCESS

BACKGROUND OF THE INVENTION

This invention relates generally to semiconductor chip device assembly, and in particular to flip chip device assembly. More specifically, the invention relates to a flip chip device assembly process that integrates solder joining and underfill operations.

In semiconductor device assembly, a semiconductor chip (also referred to as an integrated circuit (IC) chip or "die") may be bonded directly to a packaging substrate, without the need for a separate leadframe or for separate I/O connectors (e.g., wire or tape). Such chips are formed with ball-shaped beads or bumps of solder affixed to their I/O bonding pads. During packaging, the chip is "flipped" onto its active circuit surface so that the solder balls form electrical connections directly between the chip and conductive pads on a packaging substrate. Semiconductor chips of this type are commonly called "flip chips."

In a conventional method for packaging a semiconductor flip chip a semiconductor die and a packaging substrate are electrically connected and mechanically bonded in a solder joining operation. For example, an unbonded flip chip may have an array of solder balls or bumps arranged on its active circuit surface. The solder is generally composed of a eutectic material having a melting point of about 180° C. or a higher melting lead material, having a melting point of about 300° C., for example. Dies may have dimensions on the order of about 5–30 mm×5–30 mm.

Prior to bonding the die to a substrate, solder flux is applied to either the active surface of the die or the packaging substrate surface. The flux serves primarily to aid the flow of the solder, such that the solder balls make good contact with pads or presolder on the packaging substrate. It may be applied in any of a variety of methods, including brushing or spraying, or dipping the die into a thin film, thereby coating the solder balls with flux. The flux generally has an acidic component, which removes oxide barriers from the solder surfaces, and an adhesive quality, which helps to prevent the die from moving on the packaging substrate surface during the assembly process.

After the flux is applied, the die is aligned with and placed onto a placement site on the packaging substrate such that the die's solder balls are aligned with electrical pads on the substrate. The substrate is typically composed of a laminate or organic material, such as fiber glass, PTFE (such as Teflon™, available from Gore, Eau Claire, Wis.) BT resin, epoxy laminates or ceramic-plastic composites. Heat (to a temperature of about 200–300° C., for example, depending on the type of solder material) is applied to one or more of the die and the packaging substrate, causing the solder balls to reflow and form electrical connections between the die and the packaging substrate. The package is then cooled to harden the connection. Then, the remaining flux residue is substantially removed in a cleaning step, for instance by washing with an appropriate solvent.

At this point in a conventional assembly procedure, an underfill is applied in order to enhance the mechanical bonding of the die and substrate. An underfill material, typically a thermo-set epoxy, such as is available from Hysol Corporation of Industry, Calif.(product numbers 4511 and 4527), Ablestik Laboratories of Rancho Domingo, Calif., and Johnson Matthey Electronics of San Diego, Calif., is dispensed into the remaining space (or "gap") between the die and the substrate. In a typical procedure, a bead of thermo-set epoxy, is applied along one edge of the die where it is drawn under the die by capillary action until it completely fills the gap between the die and the packaging substrate. Slight heating of the packaging substrate after dispensing of the underfill epoxy may assist the flow. In some cases, the underfill epoxy flow is further assisted by vacuum, or, alternatively, by injection of the epoxy into the gap.

Thereafter, the underfill is cured by heating the substrate and die to an appropriate curing temperature for the underfill material, generally in the range of about 120 to 180° C., and then cooled. In this manner the process produces an electrically and mechanically bonded semiconductor chip assembly, with the underfill material allowing a redistribution of the stress at the connection between the die and the substrate from the solder joints only to the entire sub-die area.

A problem with such flip chip package constructions is that during the cool down from the solder joining temperature, the whole package is highly stressed prior to application and curing of the underfill material due to the different coefficients of thermal expansion (CTEs) of the substrate and die materials. Shrinkage of the substrate, typically having a CTE of about 17 ppm, is much more than that of the die, which typically has a CTE of about 2–3 ppm, e.g., 2.6 ppm. The high stress experienced by these bonded materials during cooling may cause them to warp delaminate or crack. Such stress in the semiconductor package may ultimately result in its electronic and/or mechanical failure, including cracking of the die, substrate or their solder electrical connections. This problem is particularly acute for larger die sizes, for example dies having dimensions at or in excess of 20 mm on a side, which are presently being fabricated and packaged (e.g., Altera Corporation's 2A70 die which is 23 mm×28 mm). For such large die sizes, the stress induced by the cooling following solder joining before underfill is even applied and cured may cause cracking in the die or substrate.

Accordingly, what is needed are flip chip device assembly methods that reduce physical stresses that may lead to die or substrate crack formation, particularly for large die sizes.

SUMMARY OF THE INVENTION

To achieve the foregoing, the present invention provides flip chip device assembly methods that integrate the solder joining and underfill operations of the assembly process. Solder joining of the die and substrate and curing of the underfill material between the die and substrate is accomplished in the same heating and cooling operation. As a result, the coefficient of thermal expansion (CTE) mismatch stresses incurred prior to application and curing of underfill by a device packaged according to the conventional technique having a separate heating and cooling operation following solder joining, are avoided. These stresses are of particular concern in smaller device size technologies (e.g., 0.13 microns and smaller) using low k dielectrics and large die sizes due the difference in CTE between the die and substrate.

In order to have the underfill material available in place for curing during the same heating and cooling operation that is used for solder joining, a number of different approaches for disposing the underfill material may be used. These include introduction of a liquid phase (or suspension) underfill material between an aligned die and substrate by capillary action, application of a liquid phase (or suspension) underfill material to the die and/or substrate around the solder ball positions of the solder ball array to be used to solder join the die and substrate, such as by using a stencil, prior to alignment of the die and substrate for solder joining, and application to the die or substrate prior to alignment of the die and substrate for solder joining of a solid phase underfill material predrilled to accommodate the solder ball array to be used to solder join the die and substrate. In the case of the introduction of underfill material by capillary action, preheating to a temperature below that sufficient to induce curing of the underfill material may be conducted to facilitate the capillary action.

In one aspect, the invention relates to a method of assembling a semiconductor die with a packaging substrate. The method involves providing a flip chip die and a packaging substrate, disposing an uncured underfill material between the die and the substrate, and then curing the underfill material during solder joining of the die and the substrate.

These and other features and advantages of the present invention are described below where reference to the drawings is made.

BRIEF DESCRIPTION OF THE DRAWINGS

FIGS. 2A–D depict cross-sectional views of stages in the assembly of a flip chip package in accordance with certain specific embodiments of the present invention.

FIGS. 2A' and 2B' depict top plan views of FIGS. 2A and 2B, respectively.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The present invention provides flip chip device assembly methods that integrate the solder joining and underfill operations of the assembly process. Solder joining of the die and substrate and curing of the underfill material between the die and substrate is accomplished in the same heating and cooling operation. As a result, the coefficient of thermal expansion (CTE) mismatch stresses incurred prior to application and curing of underfill by a device packaged according to the conventional technique having a separate heating and cooling operation following solder joining, are avoided. These stresses are of particular concern in smaller device size technologies (e.g., 0.13 microns and smaller) using low k dielectrics and large die sizes due the difference in CTE between the die and substrate.

Figure 1:
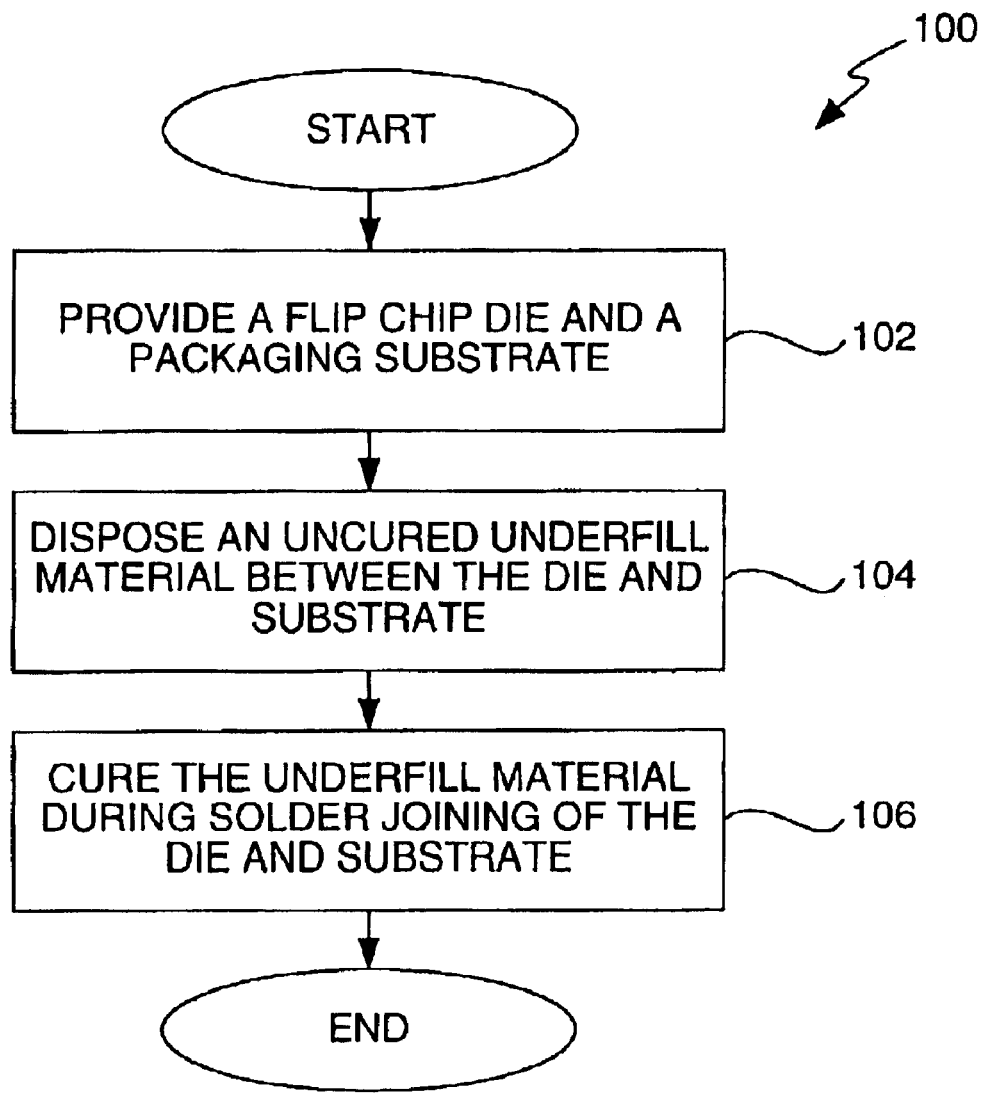
FIG. 1 depicts a flow chart showing stages of a method of assembling a flip chip package using integrated solder joining and underfill operations in accordance with the present invention.

FIG. 1 shows a flow chart 100 of a method of assembling a semiconductor flip chip package in accordance with the present invention. A semiconductor flip chip die and a packaging substrate are provided (102). The die is typically a silicon-based composite material with a CTE of about 2–3 ppm, e.g., 2.6 ppm. The substrate is typically composed of a laminate or organic material with a CTE of about 15 to 20 ppm, e.g., 17 ppm, such as fiber glass, PTFE (such as Teflon™, available form Gore, Eau Claire, Wis.) bismaleimide triazine (BT) resin, epoxy laminates or ceramic-plastic composites. The die will generally have an array of solder balls on its active surface in preparation for electrical connection to the substrate. The solder ball array may alternatively be on the substrate in some embodiments. An uncured underfill material is disposed between the die and the substrate (104) by any of a variety of techniques, several of which are described in further detail below to illustrate specific embodiments of the present invention. The underfill material is then cured during solder joining of the die and the substrate (106). The integrated solderjoining and curing is achieved by heating the package structure to a temperature above that of the curing temperature of the underfill material and the reflow temperature of the solder. In general, heating to a temperature in the range of about 200–300° C., more typically about 180–230° C. is appropriate for typically used solder and underfill materials, as described in further detail in conjunction with the embodiments described below. Following completion of the integrated solder joining and underfill operation, further assembly may optionally take place, such as the attachment of a heat spreader and/or stiffener to the package.

Suitable underfill materials may be, for example, liquid phase (or suspension) or solid phase polymer materials with curing temperatures in the range of about 120–180° C. Suitable materials include conventionally used underfill materials including thermo-set epoxies, such as are available from Hysol Corporation of Industry, Calif.(product numbers 4511 and 4527), Ablestik Laboratories of Rancho Domingo, Calif., and Johnson Matthey Electronics of San Diego, Calif.

In order to have the underfill material available in place for curing during the same heating and cooling operation that is used for solder joining, a number of different approaches for disposing the underfill material may be used. FIGS. 2A–D and 2A' and B' depict stages in the assembly of a flip chip package and illustrate some of these approaches in accordance with certain specific embodiments of the present invention.

FIG. 2A shows a cross-sectional view of a flip chip die 200 with an array of solder balls 202 on its active surface 203 in preparation for electrical connection to a substrate. FIG. 2A' shows a top plan view of FIG. 2A in order to better illustrate this aspect of the present invention. In FIG. 2B, an uncured underfill material 204 is shown disposed on the die 200 around the solder ball 202 array prior to alignment with a substrate. The uncured underfill material 204 may be a liquid phase (or suspension) or solid phase polymer, or other suitable underfill material.

In one embodiment, the uncured underfill 204 may be a liquid phase material and may be applied by to the bumped (active side bearing solder balls or bumps) die around the bumpstballs, for example, by using a stencil. Of course, any other method for effectively applying the liquid underfill to the die around the bumps may also be used. It should also be noted that it some embodiments the bumps may be on the substrate rather than the die prior to solder joining. In this event, the liquid underfill may be applied to the substrate around the bumps. Alternatively, it is also possible for the liquid underfill to be applied the one of the die and substrate pair that is not bumped. In this event, the liquid underfill may be applied around the regions where the bumps are to make contact when the die and substrate are aligned for solder joining.

In another embodiment, the uncured underfill 204 may be a solid phase material and may be applied by to the bumped die around the bumps/balls. For example, a dry film type underfill material such as described above, for example polyimide/aramidc marketed as the product Viaply, available from CTS Corporation (Elkhart, Ind.) may be pre-drilled at the solder bump locations. As with the liquid underfill embodiment described above, a solid dry film underfill in accordance with the present invention may be applied to a bumped die or substrate, or to the unbumped member of the die/substrate pair position so as to receive the bumps in its pre-drilled holes when the die and substrate are aligned for solder joining.

Figure 2C:
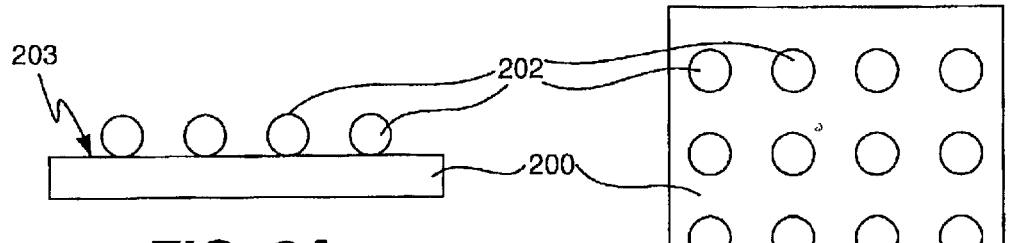
Figure 2C:
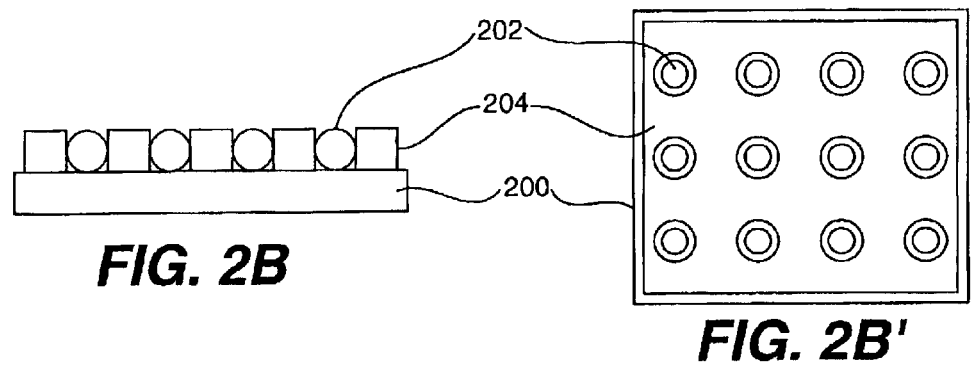
Figure 2C:
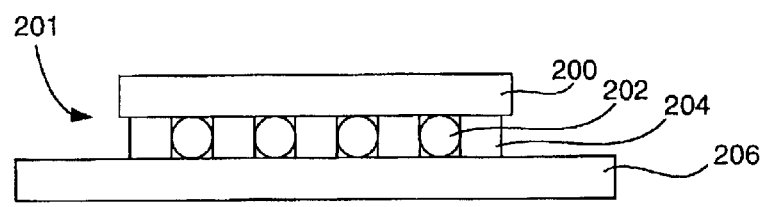

FIG. 2C shows the die 200 with the solder bumps 202 and uncured underfill 204 aligned with a substrate 206 prior to solder joining and underfill curing. Flux, preferably a non-cleaning flux or high temperature cleaning flux, is applied, and then the solder balls 202 on the die 200 are positioned on metal pads on the substrate 206 where they are to be bonded to electrically connect the die and substrate. The package structure 201 is then heated to a temperature in excess of the solder reflow temperature and the underfill curing temperature and subsequently cooled in the integrated solder joining and underfill curing operation.

Figure 2D:
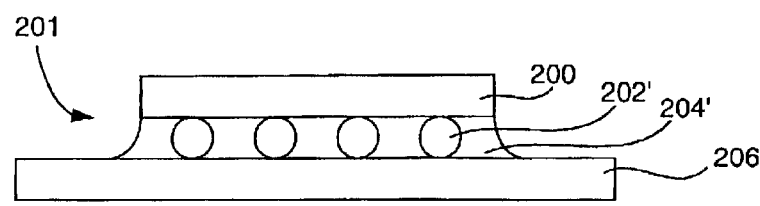

FIG. 2D shows the package structure 201 after the integrated solder joining and underfill curing operation. The die 200 and substrate 206 are mechanically and electrically connected by the solder bonds 202'. The mechanical connection of the die 200 and substrate is reinforced by the-cured underfill 204'. Since the solder joining and underfill curing are accomplished in a single heating and cooling operation, stresses on the die 200 and substrate 206 due to CTE difference are markedly decreased relative to conventional package assembly techniques having separate solder joining and underfill curing operations.

Figure 3A:
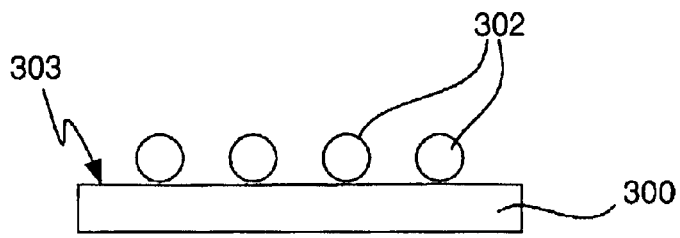
FIGS. 3A–D depict cross-sectional views of stages in the assembly of a flip chip package in accordance with another specific embodiment of the present invention.
Figure 3B:
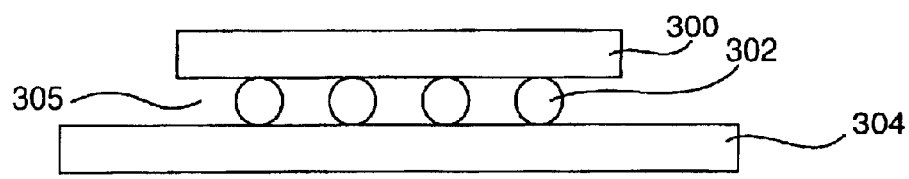
Figure 3C:
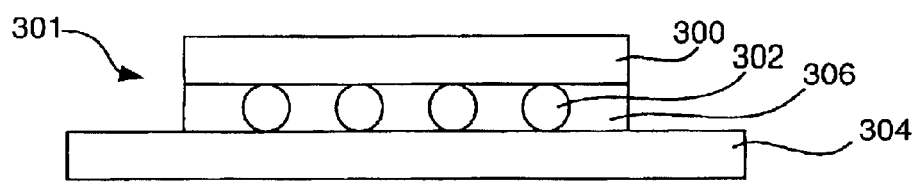

FIGS. 3A–D depict cross-sectional views of stages in the assembly of a flip chip package in accordance with another specific embodiment of the present invention. FIG. 3A shows a cross-sectional view of a flip chip die 300 with an array of solder balls 302 on its active surface 303 in preparation for electrical connection to a substrate. In FIG. 3B, the die 300 with the solder bumps 302 is aligned with a substrate 304 prior to solder joining and underfill curing. Flux may be applied, and then the solder balls 302 on the die 300 are positioned on metal pads on the substrate 304 where they are to be bonded to electrically connect the die and substrate.

Following alignment of the die 300 and substrate 304, a liquid phase (or suspension) underfill material 306 may be introduced between the aligned die and substrate by capillary action. To accomplish this, the liquid underfill material, such as described above, may be applied along one side of the die 300, typically the longer side, if any. Capillary action draws the underfill 306 into the gap 305 between the die 300 and substrate 304 and around the solder bumps 302. Heating to a temperature below the curing temperature of the underfill material, such as from about 30° C. up to about 150° C. for many suitable underfill materials, for example 120° C., may optionally be used to facilitate the movement of the underfill into the gap 305 by capillary action. In some cases, the underfill flow may be further assisted by vacuum, or, alternatively, by injection of the underfill into the gap.

Figure 3D:
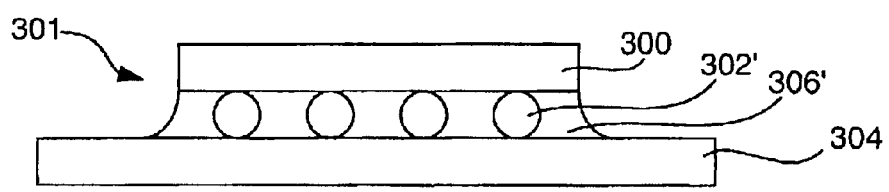

The package structure 301 is then heated to a temperature in excess of the solder reflow temperature and the underfill curing temperature and subsequently cooled in the integrated solder joining and underfill curing operation. FIG. 3D shows the package structure 301 after the integrated solder joining and underfill curing operation. The die 300 and substrate 304 are mechanically and electrically connected by the solder bonds 302'. The mechanical connection of the die 300 and substrate is reinforced by the cured underfill 304'. As with the previously described embodiments, since the solder joining and underfill curing are accomplished in a single heating and cooling operation, stresses on the die 300 and substrate 304 due to CTE difference are markedly decreased relative to conventional package assembly techniques having separate solder joining and underfill curing operations.

It should be noted that the assembly method of the present invention may be used alone or in conjunction with other flip chip packaging techniques. In many cases, the electrically and mechanically bonded die and substrate package structure will be further strengthened and operationally enhanced by the application of a stiffener and/or heatspreader. Structures and compositions for heat spreaders and stiffeners, and techniques for their attachment, are well know in the art and may be used in conjunction with the present invention. For example, these devices may be composed of a high modulus (about $9 \times 10^6$ to $30 \times 10^6$ psi), high thermal conductivity (about 2 to 4 W/cm·K) metal about 10 to 40 mils thick, having substantially the same dimensions as the package substrate. One particularly suitable material is nickelplated copper. These devices may be applied, if at all, and attached to the substrate and each other with thermo-set adhesives at any suitable point in the assembly process. In one preferred embodiment, they are applied following the integrated solder joining and underfill curing operation.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A method of assembling a semiconductor die with a packaging substrate, comprising:

providing a flip chip die and a packaging substrate;

disposing between the die and the substrate an uncured solid film underfill material predrilled to accommodate a solder ball grid array used to solder join the die and the substrate; and then, curing the underfill material during solder joining of the die and the substrate.

2. The method of claim 1, wherein the curing is accomplished by heating above both the solder reflow temperature and the underfill material curing temperature, and then cooling.

3. The method of claim 2, wherein the temperature is in the range of about 200 to 300° C.

4. The method of claim 2, wherein the temperature is in the range of about 180 to 230° C.

5. The method of claim 1, wherein the solid underfill film is comprised of polyimide/aramide.

6. The method of claim 1, wherein the die has at least one dimension at least 20 mm in length.

7. The method of claim 6, wherein the die has two dimensions at least 20 mm in length.

8. The method of claim 1, wherein the die has a coefficient of thermal expansion in the range of about 2 to 3 ppm.

9. The method of claim 8, wherein the substrate has a coefficient of thermal expansion in the range of 15 to 20 ppm.

10. A semiconductor flip chip package assembly formed according the method of claim 1.

11. A method of assembling a semiconductor die with a packaging substrate, comprising:

providing a flip chip die and a packaging substrate;

applying an uncured solid film underfill material predrilled to accommodate a solder ball grid array used to solder join the die and the substrate around solder joining points on one of the die and the substrate;

aligning the die and the substrate; and curing the underfill material during solder joining of the die and the substrate.

12. The method of claim 11, wherein the curing is accomplished by heating above both the solder reflow temperature and the underfill material curing temperature, and then cooling.

* * * * *